United States Patent [19]

Duckworth

[11] 4,290,875
[45] Sep. 22, 1981

[54] SPUTTERING APPARATUS

[75] Inventor: Roger G. Duckworth, Weybridge, England

[73] Assignee: Ultra Electronic Controls Limited, London, England

[21] Appl. No.: 131,506

[22] Filed: Mar. 18, 1980

[51] Int. Cl.³ .............................................. C23C 15/00
[52] U.S. Cl. ................................. 204/298; 204/192 R
[58] Field of Search ................ 204/192 R, 192 C, 298

[56] References Cited

U.S. PATENT DOCUMENTS 3,294,669  12/1966  Theurer .............................. 204/298

FOREIGN PATENT DOCUMENTS 1527218  5/1968  France ................................. 204/298
2015581  9/1979  United Kingdom ................ 204/298
297709   5/1971  U.S.S.R. .............................. 204/298

Primary Examiner—Aaron Weisstuch
Attorney, Agent, or Firm—Weinstein & Sutton

[57] ABSTRACT

The invention describes an electrode assembly for use in a sputtering apparatus.

In the sputtering assembly, a cathode mount is insulatingly supported on an anode and carries a target rod. The target rod has a much smaller surface area than the surrounding surface of the anode. High power is supplied to the cathode so that the temperature of the target rod should reach approximately 1000° C. This results in a high rate of sputtering and in the deposition of a pure coating.

7 Claims, 1 Drawing Figure

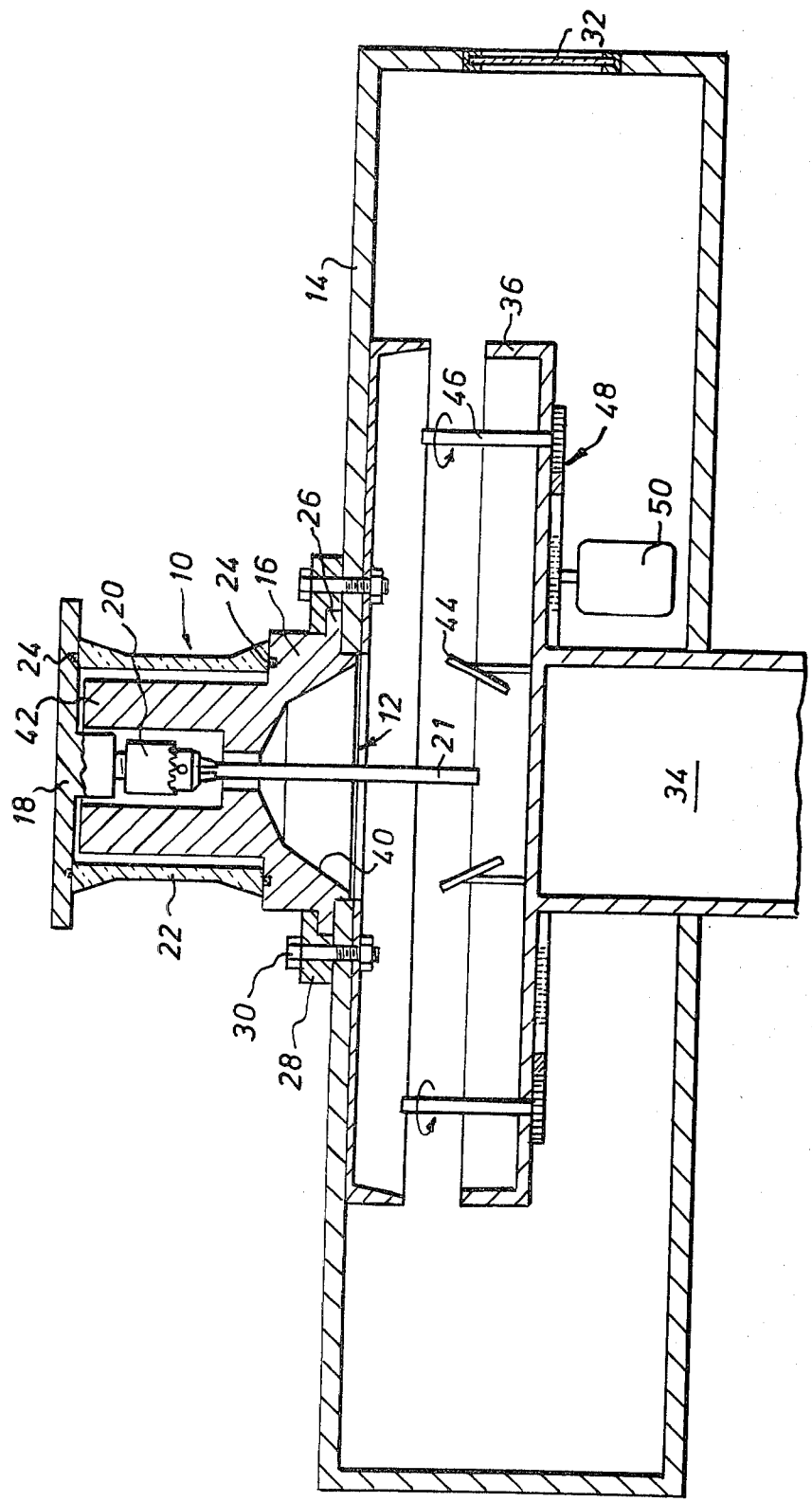

SPUTTERING APPARATUS

The present invention relates to sputtering apparatus.

The sputtering process is well known and has been used for the preparation of strongly adherent layers of a wide variety of elements and compounds.

Prior art sputtering apparatus has comprised a hollow cylindrical drum or sputtering chamber and a disc shaped target electrode arranged within the chamber. The chamber is filled under low pressure with an ionizable gas and when a high negative voltage is applied to the target electrode the gas within the chamber is ionized and accelerated towards the target. This results in sputtering of material from the target and a sputtered deposit can thus be formed on any object arranged within the sputtering chamber.

When it is desired to sputter reactive materials having a high melting point, it is desirable to have a high rate of sputtering so that the deposit is not significantly contaminated by impurity atoms but in known sputtering apparatus the resultant rise in target temperature cannot be tolerated. The mount for the target is usually cooled and because of mismatch between the expansion properties of the target and its mount, distortion in the target can occur. This and other difficulties has limited the rate of sputtering, in particular with high melting point targets.

To improve the sputtering rate, it has been proposed to employ strong magnetic fields to accelerate the formation of sputtered particles, but this is not a very satisfactory solution and it cannot be used with objects which are themselves of a magnetic material.

In most prior art sputtering apparatuses, the discharge is confined to a narrow gap between large plates. Typically, the diameter of the plates, one of which is the target electrode, would be seven times as great as their separation. If the target material is initially contaminated, any sputtered contaminated material will be redeposited on the target and thus contaminated layers are only slowly removed. Consequently, in the prior art apparatus, it was difficult to achieve a coating of high purity.

With a view to mitigating at least some of the foregoing disadvantages, there is provided in accordance with the present invention a sputtering electrode assembly for use in a sputtering apparatus, comprising a cathode mount adapted to support a target rod and to be electrically connected to a source of high voltage, an anode supporting the cathode mount and electrically insulated therefrom and means for supporting an object to be sputter-coated arranged outside the volume bound by the anode and the target rod, wherein the anode has a surface significantly greater in area than the target rod so as to enable the flow of a current of sufficient density to raise the temperature of the target rod to substantially 1000° C., said surface being rotationally symmetrical, centered on the target rod and so shaped as to direct the bombarding ions at an angle onto the surface of the target rod.

Preferably, the cathode mount is such as to provide good electrical contact but poor thermal contact with the target rod so as to limit the extent of the cooling of the target and the heating of the cathode mount.

Conveniently, the cathode mount may be formed as a chuck making a series of point contacts with the rods.

Conveniently, the surface of an object to be coated may be arranged at an angle to the axis of the target rod in order to improve the distribution of the sputtered layer.

Alternatively, an even distribution may be arranged in respect of small objects by arranging the objects at a distance from the target rod.

Where the objects to be coated are small rods, only the parts of the rod in line of sight with the target rod will receive a substantial coating and in order to achieve a coating of even distribution around the surface of a cylindrical rod, such a rod may be arranged parallel to the target rod and rotated about its own axis during the sputtering process in order to even the distribution.

The cathode mount may be mounted in a manner to be insulated from the anode by supporting the cathode on a glass cylindrical sleeve, the other end of which rests on the anode. In order to prevent the glass sleeve from being damaged, in particular by the heat generated during sputtering and by R.F. heating, the anode is preferably provided with a cylindrical extension which surrounds the cathode mount and shields the insulating glass sleeve. The surrounding sleeve has such dimensions that the gap between itself and the cathode structure constitutes a dark space within which any gas is not ionized and cannot therefore cause any sputtering.

The invention will now be described further, by way of example, with reference to the accompanying drawing which is a schematic section through a sputtering apparatus incorporating a sputtering electrode assembly of the invention.

In the accompanying drawing, a sputtering electrode assembly generally designated 10 is mounted within an aperture 12 in a sputtering chamber 14. The electrode assembly comprises an anode 16 and a cathode mount 18 including a chuck 20 serving to grip a target rod 21. The cathode mount 18 is supported on a glass sleeve 22, the other end of which rests on the anode 16. Suitable vacuum seals 24 seal the glass sleeve 22 relative to the cathode mount 18 and the anode 16 and clamping arrangements serve to clamp the glass sleeve to the anode and the cathode mount respectively. In the interests of clarity, the clamps are not shown but the glass sleeve 22 is shown to be conically tapered at each end to enable the clamps to grip the sleeve.

The anode 16 has a flange 26 which is gripped by a clamping ring 28 which is secured by means of bolts 30 to the sputtering chamber 14. The sputtering chamber 14 illustrated is one similar to those conventionally used with disc shaped electrodes although this need not necessarily be the case. The chamber is generally in the shape of a drum with an inspection window 32. Facing the aperture 12 there is a similar aperture on the other side of the drum in which there is sealingly arranged a cooling chamber 34 to which there is secured a support plate 36 for the articles to be coated.

The anode 16, which in common with the chamber 14, is made of an aluminum alloy, has a surface 40 which is generally frustoconical and with an area significantly greater than the area of the target 21. The anode 16 also has an extension 42 which extends between the chuck of the cathode mount 18 and the glass sleeve 22. The extension 42 serves as a heat shield to prevent the heat of the cathode from damaging the glass and also as a shield for radio-frequency radiation which could cause the glass to be heated. The gap left between the anode extension 42 and the cathode mount is sufficiently narrow as to act as a dark space within which no sputtering or discharge takes place during operation.

The arrangement described is shown with supports for two types of object to be coated. The first is for small plates and these may rest on suitable stands 44 which are arranged at an angle to the target rod 21 and surrounding the target rod. The support 36 also has means for mounting rod-like objects 46 to be coated and these are connected by means of a planetary gear system 48 to a drive motor 50 which is arranged to rotate them during the sputtering operation.

In use, a high-power radio-frequency signal is applied to the cathode with the chamber 14 held at earth potential. The chamber 14 is filled with an ionizable gas under low pressure and on application of the RF voltage the gas will be ionized and will bombard the surface of the target 22.

The arrangement described, having a large anode area enables very high current densities to be developed sufficient to raise the target to a temperature to approximately 1000° C. whereupon sputtering may take place at a higher rate. The target makes only poor thermal contact with the chuck 20 so that the cathode mount does not become unduly heated, the temperature being essentially confined to the target rod itself. The shape of the anode, which is inclined to the target 21, results in bombardment taking place at an angle so that the sputtering occurs at a higher rate and the sputtered particles have a net downward component as viewed. These particules are deposited on the support 36 and on any articles resting on it. It is preferable to arrange flat articles on the stands 44 which are inclined at an angle to the target rod 21 in order to optimize the evenness of the coating.

The material sputtered from the target 21 will be deposited on the target anode surface 40 and this large area will act as a gettering surface to purify the gas. This action, coupled with the higher rate of deposition, serves to improve the purity of any applied coating.

Although the sputtered particles collide with gas atoms during their transfer from the target to the object being coated, it is still true that if an article such as a rod 46 is placed in a support plate 36 the surface facing the target 22 will be coated with significantly more material than the surface out of line out of sight. To provide an even coating, such rods may be rotated by means of a suitable drive motor 50 and the planetary gear mechanism 48.

Glass 22 is not damaged by heat or radiation and additionally ensures that no discharge occurs between the cathode mount and the anode so that no sputter deposition occurs on the cathode mount or the glass 22 which would impair operation by short-circuiting the anode to the cathode.

By virtue of the fact that the objects to be coated are disposed outside the volume bound by the anode and the cathode, the objects are not heated significantly while the cooling chamber 34 provides additional safeguard against an excessive rise in temperature. As a consequence, by the use of the present invention it is possible to provide very pure coatings even on objects which cannot themselves be subjected to a severe rise in temperature, for example materials which cannot withstand a temperature in excess of 150° C.

I claim:

1. A sputtering apparatus, comprising a cathode mount adapted to support a target rod and to be electrically connected to a source of high voltage, an anode supporting the cathode mount and electrically insulated therefrom, means for supporting an object to be sputter-coated arranged outside the volume bound by the anode and the target rod, wherein the anode has a surface greater in area than the target rod so as to enable the flow of a current of sufficient density to raise the temperature of the target rod to substantially 1000° C., said anode surface being rotationally symmetrical and centered on the target rod and so shaped as to direct the bombarding ions at an angle onto the surface of the target rod.

2. An apparatus as claimed in claim 1, wherein the cathode mount is constructed to provide good electrical contact but poor thermal contact with the target rod so as to limit the extent of the cooling of the target and the heating of the cathode mount.

3. An apparatus as claimed in claim 2, wherein the cathode mount is formed as a chuck making a series of point contacts with the target rod.

4. An apparatus as claimed in any preceding claim, wherein the surface of the anode is frusto-conical, parabolic or part-spherical.

5. An apparatus as claimed in claim 1, wherein the surface of an object to be coated is adapted to be arranged at an angle to the axis of the target rod.

6. An apparatus as claimed in claim 1, wherein objects to be coated are adapted to be arranged at a distance from the axis of the target rod and means are provided for rotating the objects during the sputtering process.

7. An apparatus as claimed in claim 1, in which the cathode mount is mounted on a glass cylindrical sleeve and the anode is provided with a cylindrical extension which surrounds the cathode mount and insulates the cylindrical sleeve against damage caused by heating.

* * * * *